(12) United States Patent
Benz et al.

(10) Patent No.: US 6,483,104 B1
(45) Date of Patent: Nov. 19, 2002

(54) ROTATIONAL ANGLE SENSOR USING A CCD LINE WITH ENHANCED MEASURING PRECISION

(75) Inventors: Jurgen Benz, Besigheim; Achim Ruff, Walheim, both of (DE)

(73) Assignee: Valeo Schalter und Sensoren GmbH, Bietigheim-Bissingen (DE)

( * ) Notice: Subject to any disclaimer, the term of this patent is extended or adjusted under 35 U.S.C. 154(b) by 0 days.

(21) Appl. No.: 09/068,969

(22) PCT Filed: Sep. 17, 1997

(86) PCT No.: PCT/EP97/05142

§ 371 (c)(1),
(2), (4) Date: Feb. 11, 1999

(87) PCT Pub. No.: WO98/13669

PCT Pub. Date: Apr. 2, 1998

(30) Foreign Application Priority Data

Sep. 23, 1996 (DE) .......................... 196 38 911
Sep. 23, 1996 (DE) .......................... 196 38 912

(51) Int. Cl.[7] .................................. G01D 5/34
(52) U.S. Cl. .......................... 250/231.13; 250/231.18
(58) Field of Search ................ 250/231.13, 231.16, 250/231.18, 237 G; 341/13, 14; 701/41–43; 33/1 PT, 1 N, 534, 762, 763; 280/211, 846, 96

(56) References Cited

U.S. PATENT DOCUMENTS 5,129,725 A 7/1992 Ishizuka et al.
6,248,993 B1 * 6/2001 Bunselmeier et al. .. 250/231.13

FOREIGN PATENT DOCUMENTS

| DE | 2748320 | 5/1978 |
|---|---|---|
| DE | 3150349 | 8/1982 |
| DE | 3924460 | 2/1990 |
| DE | 4006683 | 9/1990 |
| DE | 3939353 | 5/1991 |
| DE | 4013936 | 10/1991 |
| DE | 4224654 | 1/1994 |
| DE | 4243779 | 6/1994 |
| DE | 4300663 | 6/1994 |
| DE | 4312186 | 10/1994 |
| DE | 4410955 | 10/1994 |
| DE | 4431238 | 3/1996 |
| DE | 19506019 | 9/1996 |
| EP | 165697 | 12/1985 |
| EP | 179918 | 5/1986 |
| EP | 276402 | 8/1988 |
| EP | 0377097 | 7/1990 |
| EP | 0430288 | 6/1991 |
| EP | 0660085 | 6/1995 |
| EP | 687913 | 12/1995 |
| GB | 2126444 | 3/1984 |
| GB | 2163635 | 3/1986 |

* cited by examiner

Primary Examiner—Que T. Le
(74) Attorney, Agent, or Firm—Paul Vincent

(57) ABSTRACT

It is known that CCD lines can be used to produce fast angle of rotation sensors, where the light distribution controlled by a code disk is measured with a pixel line and converted into corresponding digital values by an analyzer unit. The object of the present invention is to create a position sensor with a high resolution. For this purpose, the invention proposes several measures, such as pulsed operation of the light source and using a digital code for the code element. Advantageous embodiments involve selecting a maximum code and more accurate determination of the approximate position value thus obtained from the resulting digital value. A further improvement in measurement accuracy can be achieved by shifting the code track or several code tracks arranged radially one inside the other.

26 Claims, 5 Drawing Sheets

ROTATIONAL ANGLE SENSOR USING A CCD LINE WITH ENHANCED MEASURING PRECISION

TECHNICAL FIELD

The invention relates to a position sensor, specifically an angle of rotation sensor with a CCD line.

BACKGROUND OF THE INVENTION

CCD sensors are known, such as is described in the application brief by the Texas Instruments under the title "linear products TLS 214 integrated opto-sensor" in connection with the FIGS. 1 through 5 shown there. Details of the integrated TLS 215 opto-sensor were published in section 4.19 through 4.28 of the Texas Instruments product description and under the heading "TSZ 215, 128x1 integrated opto-sensor" under number SOES 005A—May 1993.

The known CCD line has a row of composite elements called pixels arranged side by side. Starting from an initial state in which the pixels are drained of all electrical charge, these composite elements are then charged in proportion with the light flux striking them. The varying charge on the pixels resulting from the difference in light distribution striking them corresponds to different voltage values on the pixels. At a predetermined, periodically repeated point in time, the voltages of all pixels are transmitted in parallel to the respective memory elements of a shift register, so that the voltage distribution on the individual memory elements in the shift register corresponds to the light flux supplied to the respective individual pixels. By means of suitable electronics, the composite elements (pixels) are then reset at their initial charge free state and again charged by the incident light, while at the same time the voltage values are read incrementally in series out of the memory elements of the shift register, and the analog values are converted to digital values. Thus, for example, 64 to 128 digital values are ultimately available, describing the light flux striking the respective pixels during the past time interval. With the help of a carrier with coded apertures where the light distribution is allowed to pass through corresponds to the position of the carrier with respect to the CCD line, it is thus possible to draw conclusions about the instantaneous position of the carrier during the measurement process on the basis of the measured light and voltage distribution. In the example described here, this applies to the angle of rotation of a coded disk, but also to the description of a longitudinal position of a carrier, when the linear position of the carrier is described with the help of an optically light-transmitting code. The use of such optically light-transmitting code has already been described in German Patent 195 32 903.1. The essential difference in comparison with the code disk described there is that the light flux penetrating the disk is measured not with a CCD line, but with one or more diodes. The invention is therefore based on a position sensor, in particular an angle of rotation sensor of the generic type in the definition of the species in claim 1. One disadvantage of such a sensor device is that during a sampling interval of the light flux distribution of the light flux passing through the code disk, the code disk undergoes a considerable shift with a rapid turn of the steering wheel. In other words, there is a change in the allocation of individual light-transmitting fields on the code disk with respect to the pixel, so that the light flux distribution of the incident light changes during a collecting period. This results in blurred grey scale value transitions, so that the image of the light distribution due to the code disk on the CCD line is blurred. To reduce the blurred grey scale value transitions, one might attempt to keep the number of code words and hence the code as large and as rough as possible. A rough code also serves to reduce sensitivity to dirt and to simplify code disk production. The object of the present invention is to greatly improve the known system by improving the grey scale value transitions through other measures and increasing the sensitivity of the sensor.

The invention consists in principle of greatly shortening the lighting duration of the code element, i.e., of the rotation sensor of the code disk. The code element is lighted only briefly, approximately in the manner of a stroboscope. One disadvantage of the invention could be that the light flux output and thus the charge picked up by the collecting elements is comparatively low. This situation can be remedied where the light source is operated so that the rated output is obtained for the entire period. Thus, in other words, a large amount of light is delivered by the light source for short periods of time. To be able to determine unambiguously the position of the code element after the charging process on the basis of the reduced light flux, the on-time of the light source is preferably synchronized with the sampling time and the readout timing. Tests have shown that the cyclic on-time corresponding to the features according to claim 3 should amount to less than 5% of the cycle time and, better yet, less than 1% of the cycle time.

To further improve the measurement accuracy of the sensor of the generic type the code element (i.e., the code disk for an angle of rotation sensor) is provided with code fields, which correspond to only two states. In other words, the code element is provided with code fields that either are opaque or have a defined light transmission. The light transmission corresponds to states 0 and 1 of a multistep code, where the geometric arrangement is such that increasing numbers of memory elements (pixels) are either covered by a code field or receive the light flux. It would also be conceivable to assign a separate code element to each pixel. The proposed invention serves the goal of greater security, in order to be able to decide in borderline cases whether or not a sufficient light flux has been sent to a group of pixels. The decision regarding whether or not it was a light-transmitting code field or an opaque code field is made much more reliably than when only a single pixel is present per code field. Furthermore, multiple code fields (for example, 12 code fields) are scanned by the CCD line and weighted by the sensor, with several pixels again being assigned to each code field, e.g., between 10 and 11 pixels (this is obtained, for example, by using a 12-step maximum code and a code line with 128 pixels). Using a larger number of pixels per code element or coding step of a multistep code has the advantageous effect that a light suppressing code field or a light flux transmitting code field can be recognized even when the pixel voltage, which determines the flank of the image, assumes an intermediate value. This is the case, for example, when the edge of a code field only partially covers a pixel or when stray radiation at the edges of the code field distorts the flanks readable on the pixels.

When the position sensor for determining the angle of rotation according to the invention is used in particular to determine the angle of rotation of a steering wheel, it is preferable to form the code fields of the code disk by adjacent sectors of a circle with the same sector angle In principle, the code element may be formed from a code disk on which light-transmitting and opaque sectors of a circle are arranged adjacent to one another like pieces of a pie in a sequence determined by the code. The code fields may follow one another on an ring, as if only sections inside the ring were cut from the aforementioned pieces of pie. In this case it is advisable to have the CCD line run at a tangent to the ring and above or below the code disk over the ring. Since the line is essentially a straight line, while the circular sector is curved, the light flux allowed to pass through by the light transmitting code fields also depends on the position of the respective pixels on the line. Suitable corrections can be made here accordingly to compensate for the regular reduction in light flux. In a further development of the invention, a maximum code is selected. This maximum code is characterized in that the code elements arranged in an arc in an ordered sequence of code elements lead to non-repeating coded values. In other words, 180 code fields can be accommodated on an ring, for example, where 12 successive code elements always yield a 12-step code word. If the circular disk is shifted by an angle of 2°, i.e., by one code element, the result is a new code word. All 180 possible code words are different from one another, and a new first step is always added and the last step is omitted only when there are adjacent code fields (or reversed with the opposite direction of rotation).

To achieve a greater redundancy, the combination begins with a maximum code of 4,096 code words, using only a comparatively small section of this code word sequence which includes 180 code words. One has essentially free choice as to which section of 180 code words is to be selected from the total sequence of 4,096 code words and applied to the code disk in an annular form. It is advisable for the CCD line to be arranged so it is tangential to an ring for a specific embodiment of the code field.

Another possible arrangement of the code line is given where the code line is arranged radially. Therefore, the steps of the multistep code word read out of the code line must be arranged radially side by side. Such a radial arrangement may be expedient, for example, when the extent of the available ring is comparatively small, as with a lateral surface of a steering column assembly. However, the code words arranged radially need not be arranged on the lateral surface area of a hollow cylinder, they may also run radially on a circular disk. In both cases, a Gray code is preferably used.

To be able to use microprocessors in analyzing the code words read out, it is advisable in a further refinement of the invention to use the combination of features according to claim 11.

According to this, the code words analyzed are analyzed by a microprocessor, by checking for errors, and determining the measured angle on the basis of the code word thus found.

It was explained above that a step in a multistep code is not determined by a single pixel, but instead the curve contour of this step is practically circumscribed by the voltages of several pixels.

Now, while the corresponding (12-step) code word can be found with a knowledge of the curve determined by the 128 pixels, and thus the angle value can be determined to 2° with sufficient approximation, various schemes are set forth to determine the angle with a greater accuracy. Thus, not only is the multistep code word determined in general, but also its position relative to the beginning and end of the CCD line is determined. This yields a great increase in accuracy in determination of the precisely measured angle. In other words, if one finds that the edge of one or more steps is shifted to the right or left, e.g,. by 1 pixel relative to the normal position, then the measured angular position can be determined with a 10-fold accuracy in this way, since approximately 10 pixels describe a coding step, which results due to the code field. In this way, one can use various strategies. For example, the shift in the flank or the shift in the maximum of one or more coding steps relative to a normal position can be determined.

With corresponding analysis algorithms (software), a resolution in the sub-pixel range can be achieved. To increase accuracy, the contrast between reproduction of light-transmitting code fields versus opaque code fields can also be determined. A reduction in differential values (contrast) be detected here due to soiling of code fields due to some dirt on the light-transmitting fields. If the contrast sinks below a certain threshold, it may mean that the disk needs to be cleaned or replaced. The transmitting power of the light source be adjusted to restore the desired contrast by increasing the transmitting power or lengthening the transmitting time.

This principle can be used with all CCD line sensors and is an additional independent embodiment to improve the sensitivity of the sensor. In analysis of the analog values provided by the CCD line, the analog value is first converted to a digital number which describes the amplitude value of the pixel voltage and then the measured angle of rotation value is calculated on the basis of the digital number, with all the additional computations such as error correction and other test steps. Since the conversion of analog value into digital value can take place in parallel with calculation of the angle value, it is proposed to use on A-D converter and a computer in parallel. These measures can be used for all sensors. If a digital value is formed through converting an analog value, then conversion of the next value is triggered by an interrupt, and after that, calculation of the angle value by the computer is continued.

As mentioned above, the invention relates to an angle of rotation sensor, specifically a steering angle sensor for motor vehicles. Such sensors are required for the control systems for controlling the driving stability of motor vehicles. With such sensors, at least one circular code track is usually provided on a code element, with non-repeating code words applied to the code track. The code element is linked to the steering column assembly of the motor vehicle. In this way, the slewing motion of the vehicle's wheels can be deduced from the rotational movement of the code element.

Since only one specific code word can be read by the reading device in each rotational position of the code element, the position of the code disk and hence the angular position of the steering wheel of the vehicle can be deduced on the basis of the code word found. One problem is that the steering wheel must make several revolutions to execute the total possible slewing motion of the steering wheel. Thus it is not only important to know the absolute rotational movement of the steering wheel, but also the number of revolutions of the steering column assembly with respect to a zero position must be known to be able to determine definitively the slew angle of the steering wheel. For this purpose, German Patent Application No. P 8636 by the present applicant has already proposed that a sequence processor be provided with a counter, which is incremented or decremented as a function of the revolutions executed by the code element, so that the number of the revolutions of the code element with respect to a zero position is always known.

The object of the invention is to eliminate the need for a sequence processor for determining the number of revolutions currently in effect and to integrate the measurement of revolutions into the actual angle of rotation sensor.

The invention consists in principle of providing several code tracks arranged across the direction of movement of the reading device and advancing the reading device to the individual code track according to the number of revolutions currently in effect. Thus the instantaneously valid revolution can be determined on the basis of the code track just scanned. This may take place by scanning within each track a special code which indicates the number of revolutions. However, it is also possible to distribute a continuous code (for example, a maximum code) over all the tracks in such a way that not only the absolute angle of rotation but also the number of rotations is determined at the same time with the help of the decoded code words.

An especially simple arrangement of code tracks results where the individual code tracks are connected in the form of a spiral. This may be accomplished, for example, by moving the reading device one track higher or lower, depending on its rotational movement, for a certain absolute angular position. However, the entire code track becomes especially simple when it forms a continuous spiral track, so that the direction of movement of the reading device does not undergo any great change, except for switching from forward motion to reverse motion. Then the code track can be arranged in a spiral form either on a circular disk or on the lateral surface of a cylinder. Both the transmitted light principle and the reflected light principle can be used. If the cylinder is not hollow, the reflection principle should be used, for example, when the code track is applied to the steering column assembly in spiral.

A large number of different conveyance means may be used to move the reading device. The conveyance device described in claim 20 has been found to be especially advantageous, in that the guidance means are arranged directly next to the code element and the reading device. It is especially effective when the guidance means assigned to the code element is run parallel to the spiral code track. The design becomes especially simple when the code on the code element works by the transmitted light principle. It is expedient here to arrange the code, i.e. the perforations on the code disk, on the bottom of the guide groove, because the disk is thinner there anyway. At the same time, the reading elements, such as diodes, CCD line, Hall element or the like may be arranged on the surface of the reading device facing the bottom of the groove, so that it is located directly beneath the passages forming the code in such a way as to be shielded on the sides.

To avoid having to establish a special code with regard to the number of revolutions at a given instant, it is preferred that the code is formed by a continuous maximum code that extends over the entire spiral. Since none of the code words are repeated, not only the absolute angle, but also the corresponding number of rotations can be encoded within these multistep code words also at the same time.

The reading device becomes especially simple when using a CCD line. However, the reading element, such as diodes or Hall elements, for example, can be pointed at tracks running parallel to one another, so that the absolute rotational position and also the relative rotational position of the code element can be determined with respect to the reading elements in this way.

DETAILED DESCRIPTION OF THE PREFERRED EMBODIMENT

Figure 1:
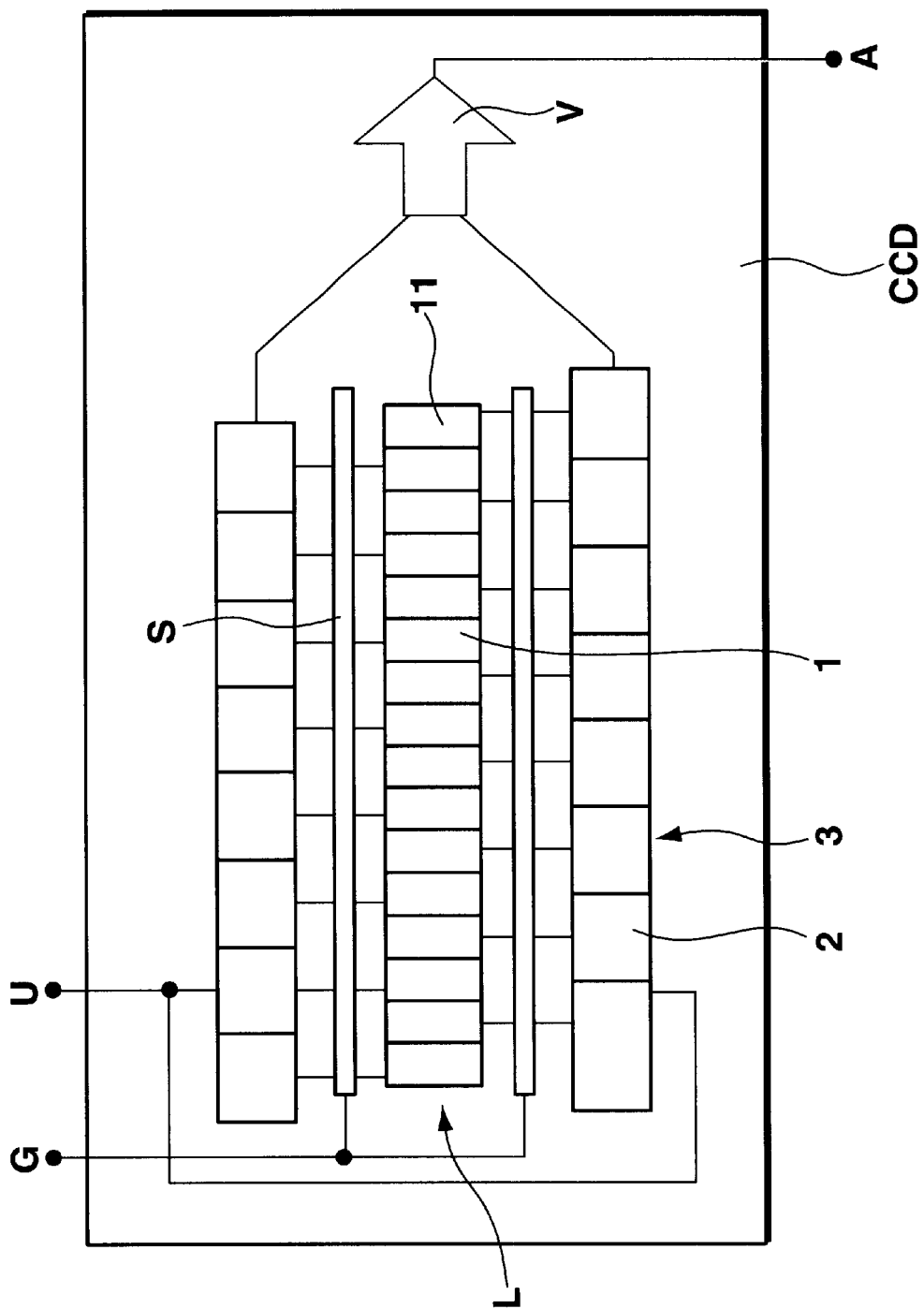
FIG. 1: the schematic design of a CCD line.
Figure 2:
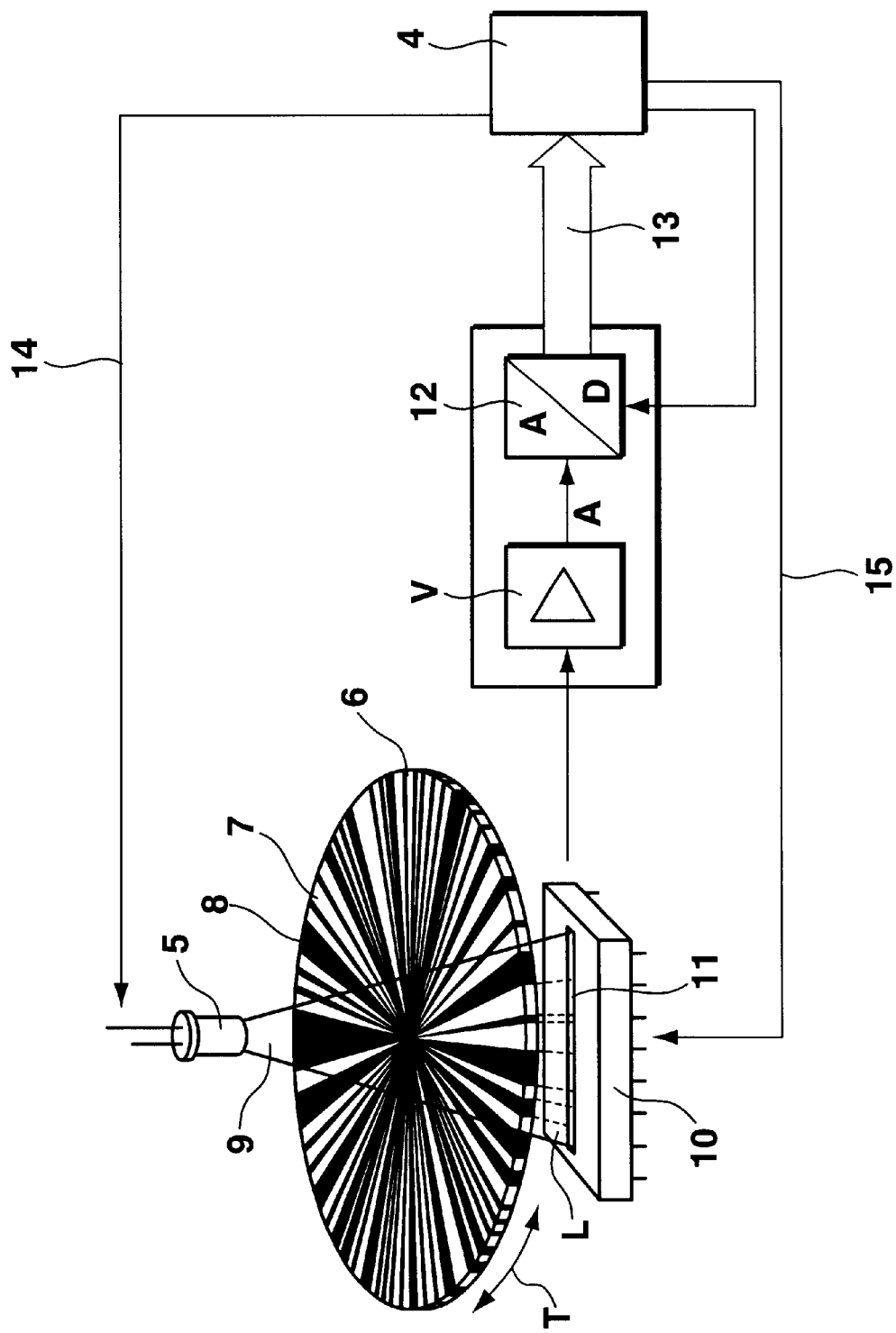
FIG. 2: a symbolic diagram of the structure of an angle of rotation sensor according to the invention.

FIG. 1 shows the scheme, as it has already been described in conjunction with the literature citations discussed in the preamble. FIG. 1 shows, for example, 16 light-sensitive pixels 1 which receive a light flux L. The distribution of the light flux striking the individual pixel 1 depends on the code of a code element, which is in the form of a code disk in the present example (see FIGS. 2 and 3). The light distribution of light flux L depends on the instantaneously valid code word on the code disk, which in turn depends on the angle of rotation of the code disk. Depending on the distribution of the light flux L over the individual pixel 1, corresponding charge is collected there and in turn leads to the respective voltage at the output of the pixel. After a predetermined period of time, the gate S is opened by way of terminals G and U, so that the voltage values of the individual pixel 1 are transmitted in parallel to the respective memory positions 2 of shift register 3. Thus, there is an image of the voltage values of the pixels in the respective memory positions of shift register 3. Then pixels 1, for example, are reset to their initial status by discharging and then are again exposed to light flux L. During this lighting time, shift register 3 is read out incrementally in series with readout stage V and is available at output A (FIG. 2). After the shift register is emptied, the voltage values of pixels 1 formed in the meantime can be again transmitted in parallel to shift register 3, where they are then read out serially again.

FIG. 2 shows a symbolic representation of how the sensor works. The infrared LED which is pulsed as light source 5 in dependence on computer 4 emits a light band to code element 6, which is in the form of a code disk. The code disk has sectors of light-transmitting fields 7 and opaque fields 8, where 12 of these adjacent fields yield a 12-step code word. The code on code disk 6 is a maximum code, i.e., the individual code words are formed by a window having 12 steps. If code disk 6 revolves by one step, this forms a new code word, so that a new first step is added and the last step of the preceding word has been omitted. None of the possible code words is repeated on the disk. Code fields 7, 8 are either light-transmitting or opaque, and it is possible for several code fields of the same light transmittance to lie side by side and thus form in a large sector of a circle accordingly. Planar light bundle 9 strikes code disk 6, and parts of the light bundle are transmitted through corresponding code fields 7, while other parts of the bundle are not transmitted through to CCD line 10. This results in a light distribution L on CCD line 10, which strikes pixel row 11 and charges the pixels accordingly. The pixel voltages are then periodically transferred to a shift register, as already described in conjunction with FIG. 1, and then sent serially to an analog/digital converter 12 over a readout stage V. This analog/digital converter may also be integrated into CCD line 10, forming a so-called integrated opto-sensor. It is also possible to use an A/D converter within the micro controller.

The digitized initial value 13 of the converter 12 is then sent to computer 4, which in turn controls the pulsed operation of LEDs 5 and the resetting of pixel line 11 as well as transfer from the shift register (not shown in detail here) over control lines 13, 14. Then finally the appropriate code word is recognized in the computer 4 from the digital values at output 13, and the measured angle of rotation of code disk 6 is then determined roughly from this. Precision determination of angles is possible by analysis of the edges (0–1 transitions) or emphasis in the 0 or 1 fields.

Figure 3:
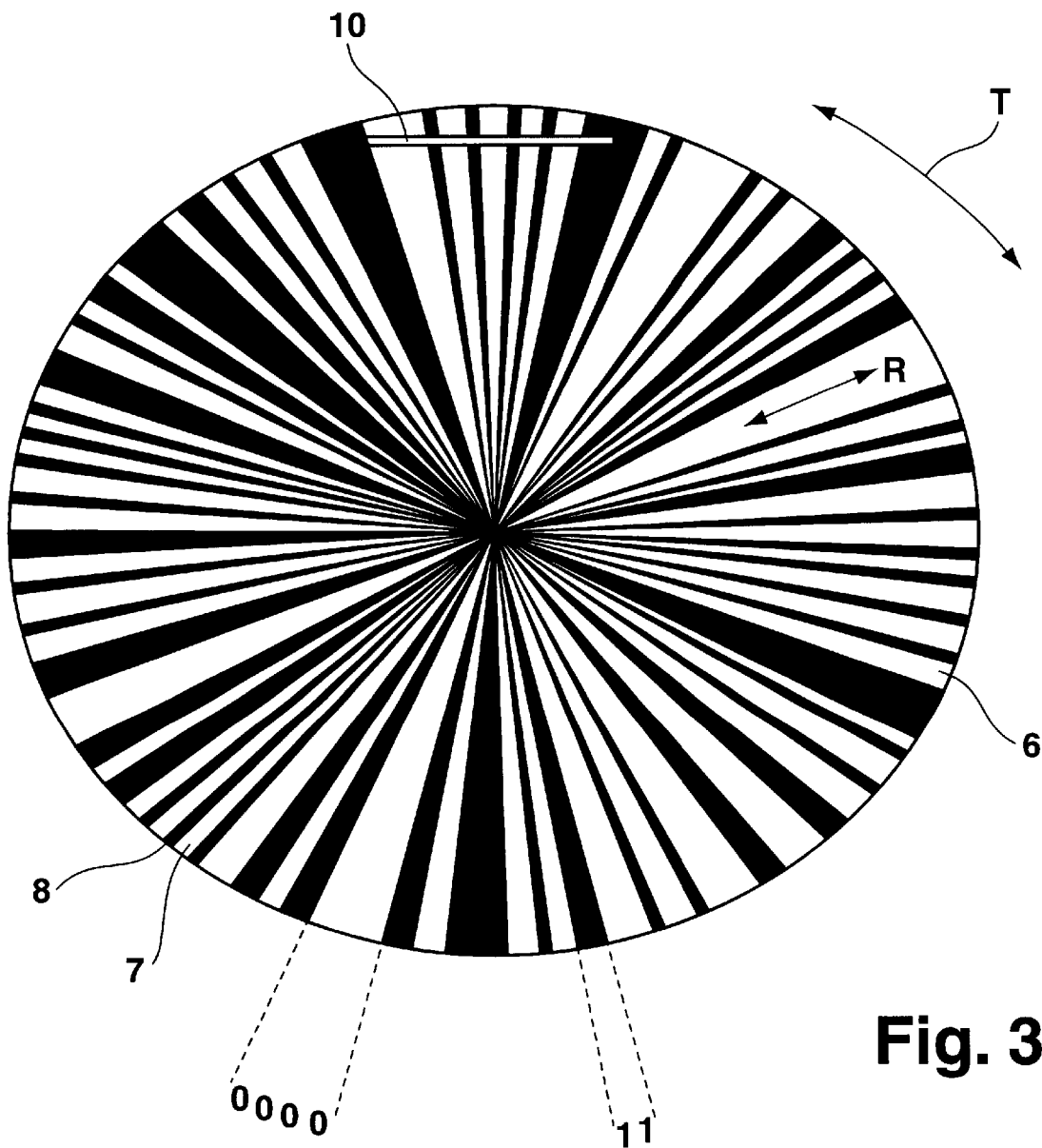
FIG. 3: the structure of a code disk for an angle of rotation sensor with tangentially oriented CCD line.

FIG. 3 shows code disk 6 with the individual code fields 7, 8 corresponding to 0 and 1 values. CCD line 10 is arranged tangentially on the side opposite light source 5, as already shown in FIG. 2, in such a way that a 12-step code can be read from it. If it is assumed that CCD line 10 is provided with 128 pixels, and 180 different angle values can be described by means of the 12-step code as an approximate measurement, then approximately 10 pixels correspond to each step of the code word. FIG. 3 shows the maximum code used, where the individual steps, which in turn correspond to code fields 7, 8, are designated as 0 or 1 (0 being opaque, 1 being light-transmitting). When the disk revolves below CCD line 10, a new step appears at the beginning of the line, while at the end of the line the last step no longer has any effect on the line.

Figure 4:
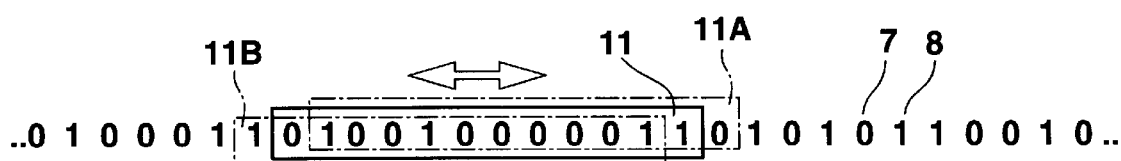
FIG. 4: a detail of a maximum code, as arranged on the disk according to FIG. 3.

FIG. 4 shows the effect of the maximum code, whereby when code disk 6 revolves beneath pixel line 11, the sequence of code fields 7, 8 is shifted to the right or left according to the direction of revolution of code disk 6. In the figure, this is shown as the shifting of the pixel window toward the right or the left to position 11*a* or 11*b*. This yields new 12-step code words accordingly.

Figure 5:
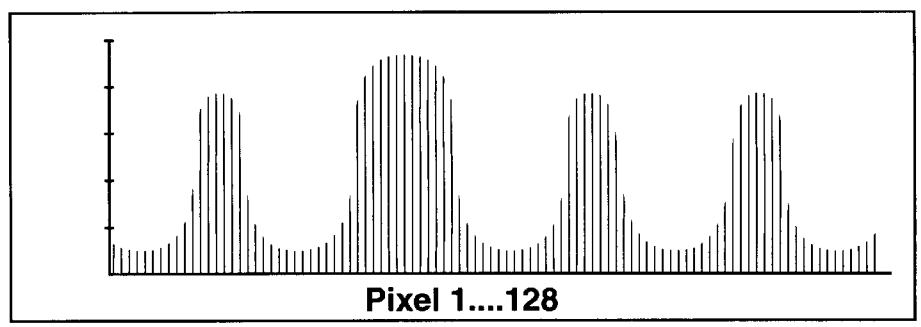
FIG. 5: digitized pixel voltages.
Figure 6:
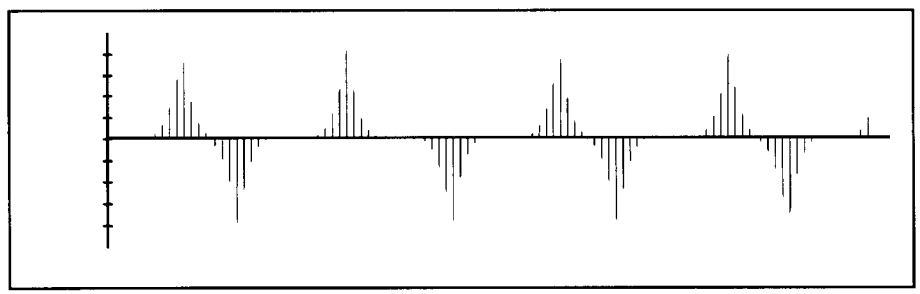
FIG. 6: differentiated voltage values according to FIG. 5.
Figure 7:
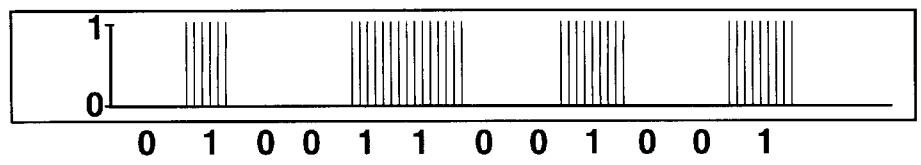
FIG. 7: diagram of a 12-step code, wherein the zero and one values derived from individual pixels are of the same magnitude, and the edges of the pulses are determined by the turning points of the pulse slope according to FIG. 5.

FIG. 5 shows the digitized voltage values at output control 13 in FIG. 2, corresponding to the individual 128 pixels. This clearly shows an enveloping curve which makes it possible to determine the instantaneous code word, which in turn describes the angle of rotation just measured for code disk 6. To recover the code word, similar voltage values are differentiated (FIG. 6), with the extreme values of the differentiation curve according to FIG. 6 forming the edge positions for the code word processed. In FIG. 7, the respective digital value of the 12-step code word was written under the converted pixel voltages. The code word indicates accurately to 2° the angular position of the code disk. However, it is possible to determine the measured angle even more accurately by calculating the displacement of the code word on the axis relative to a zero position. As shown in FIG. 6, code word 7 is shifted slightly to the right, because the individual code fields 7, 8 correspond approximately to 10 pixels. From the shift of the code word in FIG. 7 relative to the zero position, it is possible to determine whether the actual angle of the code disk is somewhat larger or smaller than the 2° value determined roughly before. In this way, it is possible to achieve a resolution of approximately 0.1° by taking into account the displacement of the code word with respect to CCD line 10. Also important for the invention is the fact that the maximum code used is only a portion of a code word comprising 4,096 code words, while the selected portion comprises 180 code words. Without taking into account other information, this yields a high probability of detecting any errors that occur, namely a probability of 96% (W=(4,096−180), 4,096=0.96). Further optimization of the code up to a 100% probability of error recognition is possible by taking into account other criteria, such as minimal Hamming distance.

Review

Introduction: Discrete optical or magnetic components are frequently used in digital sensors for determining the steering wheel angle. The resolution that can be achieved in this way depends essentially on the number and positioning accuracy of the sensors used, the mechanical boundary conditions and the tolerance situation and is often inadequate. To increase the resolution, the optical principle described above based on a CCD line (charge-coupled device line) may be used.

A CCD line is an optical sensor consisting of a large number (e.g., 64, 128, 256, 1024, etc.) of sensor elements arranged linearly in a housing. The sensor voltages and currents corresponding to the grey scale information can be read out with the help of external electronics or electronics integrated into the system. As a result of the high pixel count, the data records can be processed in a microprocessor according to digital image processing, which permits a very fine angle determination.

Function Principle: The entire sensor comprises essentially a light source, a coded disk (or similar device), the CCD line and the electronic analyzer. The steering wheel angle position is determined from the grey scale value distribution on the optically sensitive area of the line, which is due to the code disk.

When using a code disk, the CCD line can be positioned both tangentially and radially to it. With a tangential arrangement, the code (e.g., a maximum code) is at the periphery of the code disk, and with a radial arrangement, the code (e.g. Gray code) is integrated into the disk in a ring. As an alternative to using a code disk, the code can be applied to other components to save space (e.g., steering column; axial and tangential sensor positions possible). Depending on the boundary conditions with regard to the design, soiling problems, etc., the transmitted light principle or the reflected light principle will be preferred.

For simple manufacture and to improve the susceptibility to dirt, the "largest" possible code structures (wide 0–1 information carriers) are to be used. When using a code disk with a tangential sensor position, the absolute angle can be determined roughly on the basis of the real code. A fine angular resolution is obtained by, for example, determining and analyzing the edges of the 0–1 transitions or the areas of emphasis of the light and dark fields.

The scanning time of the code with the CCD line cannot be shortened to an unlimited extent. The resulting vague gray scale value transitions that occur with rapid turning of the steering wheel can be improved by using a light source that is pulsed instead of being on continuously. The on-times should be synchronized with the scanning and readout times (e.g., triggering the light source with the micro controller).

With appropriate software algorithms, there are no tolerances (e.g., positioning accuracy of the sensor, radial and wobbling movement of the code disk, age of the light source, . . . ) or they can be compensated within certain limits. In addition, error detecting mechanisms can be integrated.

The figure shows a possible concept of the electronic analyzer, where the grey scale information of the optical sensors of the CCD line, controlled by the micro controller, is sequentially read out, digitized by an A/D converter and then entered into the controller. For rapid conversion times, an external A/D converter is necessary, but at a lower clock frequency the converter integrated into the controller is sufficient. The data record which is completely available in the micro controller after the readout process is then analyzed with the respective software. When processing of the grey scale information is concluded, the readout of the next data record begins.

In general, use of a CCD line is applicable not only in a steering angle sensor, but it can also be used in general for linear and rotational position sensing.

As mentioned above, to minimize the time required for the digitization, a fast external A/D converter (ADU) is required (the AD converter integrated into the micro controller is relatively slow.) The following method is possible to eliminate the need for an expensive external AD converter: while the data record already entered in the preceding cycle is being analyzed, parallel to that, the individual analog values of the next data record are "slowly" digitized and stored in parallel in the A/D converter integrated into the microprocessor. This means that after a digitization process is finished, the analysis routine of the data record is stopped by an interrupt, the digitized value then available is stored, conversion of the next analog value is started and the routine previously interrupted is continued. This is repeated until all the analog values of a data record are digitized.

Figure 8:
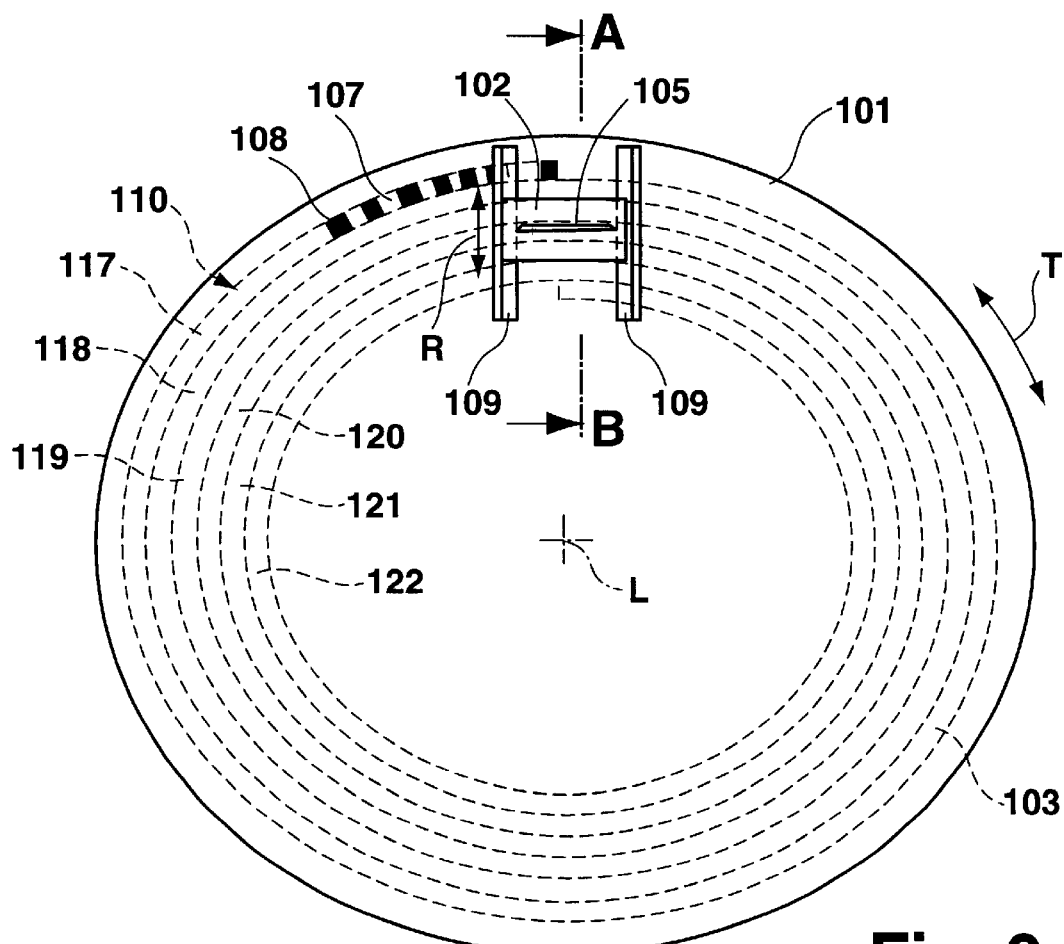
FIG. 8: a code disk with the CCD line arranged tangentially beneath it.

FIG. 8 shows as the code element a code disk 101, whose angle of rotation is to be determined. A CCD line is arranged below code disk 101, as described previously. The operation of the CCD line in combination with the code disk has already been described in the Application Brief of Texas Instruments "Linear products, TSL 214 integrated optosensor" concerning the Texas Instruments TSL 214 opto-sensor. Code disk 101 is provided with a spiral code track 103 on which a continuous maximum code is applied over all six turnings. This maximum code is characterized in that it receives continuous coding, so that multistep code words (for example, 14-step code words) can be read incrementally, and the individual code words that can be read out are not repeated over all six tracks (see details in this regard above in this patent application.)

Figure 9:
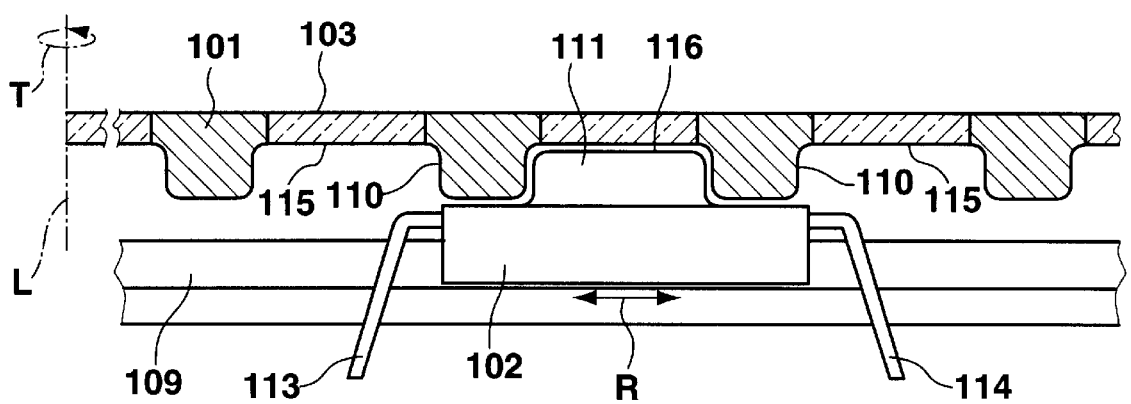
FIG. 9: a conveyance device for conveying the CCD line in a radial direction.

FIG. 9 shows a short section of the entire code.

CCD line 102 is equipped with a row (105) of light-sensitive elements (so-called pixels) side by side by means of which the code word just scanned is read out. The code works according to the transmitted light principle, i.e., above the plane of observation of FIG. 8 there is a light source which lights up the light-transmitting code fields 107, while the opaque code fields 108 do not let any light through to pixel row 105. This yields a light distribution on the pixel row by means of which the code word which depends on the angle of rotation position of the code disk can be read over pixel row 105. A carriage 109 by means of which CCD line 102 can be guided radially is especially important for the invention. The carriage and CCD line are located below the code disk 101.

FIG. 2 shows code disk 101 greatly enlarged, in a sectional view, where the disk rotates about longitudinal axis L in direction T (see also FIG. 8). The section shown in FIG. 9 runs along line A–B in FIG. 8. Code disk 101 is provided with a spiral groove 110, in which in a corresponding projection 11 on the CCD line 102 engages. Like the magnetic head of a phonograph, the CCD line is advanced to the right or left in the direction of movement R depending on the direction of rotation T. Opaque and transparent code fields 107, 108 are worked into the bottom of spiral groove 110, where they receive light from the light source (not shown) above the code disk in FIGS. 8 and 9. The light penetrating through the code fields is recognized by pixel row 105 and the code word thus read is identified, thus making it possible to determine angle of rotation of code disk 101. The code word thus identified describes not only the absolute angle of rotation of the disk, but also the current number of revolutions. The code word thus determined or the voltage values of the individual pixels needed to determine the code words can be picked off at terminals 113, 114.

To be able to read the individual code words by means of the reading device, a light source must be provided. In the simplest case, this light source may light the entire code element essentially uniformly, so that all code words can be read theoretically, but the only code actually read is the code word that can be read by the reading device in its instantaneous position. In the case of such large-area lighting of the code element, the light source may be stationary. For this purpose, the transmitted light principle and the reflected light principle are both suitable, i.e., the reading device analyzes either the light passing through the code element or the light reflected by the code element. Another possibility is to guide the light source parallel to the reading device, whereby essentially the area of the code element around the reading device is lighted, and again either the transmitted light principle or the reflected light principle may be used. In this embodiment, the light source is preferably arranged to be mobile. This is true at least for direct lighting of the code element. Another possibility may be to again arrange the light source in a stationary position in this case, but the light is guided over an optical waveguide to follow the change in position of the reading element.

Review

Systems available up to now for determining the absolute steering wheel angle are limited in principle to an angle range of 0° to 360°, regardless of the physical sensor principle selected (e.g., optical or magnetic). If the turning of the steering wheel exceeds this range, according to the periodic continuation, only the absolute angle in the value range of 0° to 360° is recognized. If an absolute angle with a corresponding number of revolutions n is desired, where $$\alpha = n \times 360° + \alpha'$$

this will requires an additional sensor unit, comprising special gears, sensor technology and electronics, for example. This additional unit will determine the number of revolutions n, and then a can ultimately be determined by means of software.

The present patent application relates to a sensor principle with which the absolute angle, including the number of revolutions can be determined by using only one sensor unit (e.g., photosensitive or magnetosensitive line). Such a procedure can be used not only to determine the steering wheel angle, it can also be used for all applications wherein the absolute angle is to be determined over a range of several revolutions.

Sensor principle: The essential principle of this absolute angle measuring system is a code track with several windings applied in a spiral to a code disk (the number of code track windings corresponds to the number of revolutions of the angle range to be detected). This code is carried over a sensor line. Depending on the number of revolutions, this line is located at the corresponding winding of the spiral code track on the basis of a suitable mechanical entrainment and guidance.

The code applied to the code track is a maximum code optimized to various criteria. In other words, the respective bit combination imaged on the sensor line exists only unicatively in the entire angular measurement range.

Possible implementations: The code track spiral can be integrated in various ways. Possible variants include application to a planar disk (direction of movement of the sensor line: radial to the steering column) or integration onto the jacket of a rotationally symmetrical cylinder (direction of movement of the sensor line: axial to the steering column). One possible design is shown as an example in the attached figure, where it contains a disk with a spiral code track, the sensor line, the radial sensor guidance and the mechanical entrainment option of the sensor.

For entrainment of the sensor, various mechanical options are conceivable: as indicated in the design example, webs are provided between the code track windings which entrain the sensor element in the radial direction. Likewise the entrainment option of applying the code track to the lateral or surface area of a round cylinder by means of such webs is conceivable. In place of the webs shown here, other variants are possible for entrainment (e.g., grooves). As an alternative, the sensor movement can also be implemented with a gear. The example shown in the figure represents the simplest implementation principle from the design standpoint. Depending on the application, the individual possibilities enumerated here must be weighed against one another.

The charge coupled device (CCD) line based on the photoelectric effect is predestined for use as a sensor element. Also conceivable are linearly arranged, discrete optical sensors (e.g., optical array) or magnetic sensor elements, which also are arranged in a line. The geometric dimensions of the row and the number of sensor elements required must be adapted to the code.

When using the optical sensor principle (e.g., CCD line), both the transmitted light principle and the reflected light principle are both suitable, but the transmitted light principle is preferred because it is less susceptible to problems (the 0–1 level interval is reduced in the reflected light principle due to dirt, tarnishing, aging, etc.). In both methods, the light source may be guided either by the movement of the sensor (focused light beam) or the entire area traversed by the sensor may be lighted as an area. If the position of the light source is limited for design reasons, the light may be guided over plastic optical fiber, where a lens characteristic can be implemented to generate a defined light distribution in a light outlet of the conductor. The light source works in the adaptive pulsed-mode operation to increase the edge sharpness, even in rapid turning of the steering wheel, and to compensate for variations in lightness (e.g., due to age).

Advantages of the method: Absolute angles for a large range of values are possible: e.g. ±1080° for six code track windings. No additional sensor technology or analysis of rotational speed is necessary. When using a CCD line and suitable analysis algorithms, a high resolution can be obtained. Relatively simple construction. Small space requirement.

What is claimed is:

1. Position sensor, especially an angle of rotation sensor for measuring the steering angle in a motor vehicle, of the type including a light source that emits a light flux striking a CCD line, wherein said light flux is selectably interrupted by a code element as a function of the position of the code element, comprising:

an analyzer unit for determining the position of the code element on the basis of the light distribution on the CCD line, means for activating said light source in a pulsed mode of operation.

2. Position sensor according to claim 1, wherein the light source is operated at a maximal power rating for pulsed operation.

3. Position sensor according to claim 1, wherein the light source is turned on in cycles, with the on-time being less than 5% of the cycle time.

4. Position sensor, especially an angle of rotation sensor for measuring the steering angle in a motor vehicle, of the type including a light source for emitting light flux against a CCD line, wherein said light flux is selectably interrupted by a code element as a function of the position of the code element, wherein the position of the code element is determined by an analyzer unit on the basis of the instantaneous light distribution on the CCD line, comprising:

code fields attached to said code element which include opaque portions and light-transmitting said fields used for determining the distribution of the light flux striking an individual pixel of the CCD line.

5. Position sensor according to claim 1, wherein the code element is a code disk and the code fields are preferably essentially formed by adjacent sectors of a circle with the same sector angle or by sections of said sectors.

6. Position sensor according to claim 5, wherein the code fields are arranged sequentially on a closed ring, which is preferably on a circular disk, and the code line is tangential to the ring.

7. Position sensor according to claim 1, wherein the code element is in the form of a circular disk or a lateral surface of a cylinder, and the code fields are arranged sequentially in multiple concentric rings, and the CCD line is arranged so that it extends over multiple rings, where the code words scanned by the CCD line preferably correspond to a Gray code.

8. Position sensor according to claim 1, wherein the light-transmitting and opaque code fields are arranged in the form of a multistep maximum code.

9. Position sensor according to claim 8, wherein the maximum code used consists of a series of 180 code words.

10. Position sensor according to claim 8, wherein the code word sequences are selected from the code word string according to the following series of specifications:

a) the code word sequence must in turn yield a self-contained closed maximum code, b) there should be shortest possible sequences of similar light-transmitting and opaque code fields, c) there should be as many changes as possible between light-transmitting and opaque code fields, d) there should be the largest possible Hamming distance between adjacent code words.

11. Position sensor according to claim 1, wherein the analyzer unit converts the voltage impulses delivered by the CCD line into corresponding digital values.

12. Position sensor according to claim 11, wherein the analyzer unit analyzes the curve imaged by the sequence of digital values according to the features describing the curve, such as curve flanks and/or extreme values, and it determines the relative position of the curve trace thus obtained relative to a normal position.

13. Position sensor according to claim 11, wherein the analyzer unit is provided with a control unit which adaptively increases the transmitting power or the light intensity of the light source when there is a drop in the maximum amplitude values of the measured voltages on the pixel line or the corresponding digital values.

14. Position sensor according to claim 11, wherein the analyzer unit is provided with a micro controller, which has a computer and an A-D converter which can work in parallel concurrently, and after conversion of an analog value into a digital value, calculation of the curve and its analysis are interrupted by an interrupt, a command to convert the following analog values is given until all the pixel voltages have been digitized, and then the calculation -of the previous data record can be completed.

15. Position sensor according to claim 11, wherein the code element is provided on the steering column of a motor vehicle, and the code is formed according to the reflection principle.

16. Position sensor according to claim 11, wherein the transmitted light principle or the reflected light principle can be used.

17. The position sensor of claim 4 with a circular code track which is provided with code words on a code element, where the steering angle is determined on the basis of a code word, which is read by a reading device according to an angle of rotation position of the code element, and means are provided through which the number of revolutions of the code element relative to a zero position can be determined, the position sensor further comprising code tracks arranged essentially in a circle which are disposed radially across a scanning direction, and a conveyance device for moving said reading device to the individual code tracks according to the number of revolutions relative to a zero position.

18. Angle of rotation sensor according to claim 17, wherein the code tracks are connected in a spiral so that the entire code track forms a spiral.

19. Angle of rotation sensor according to claim 18, wherein the code track is arranged on a circular disk or on the lateral surface of a cylinder.

20. Angle of rotation sensor according to claims 17, wherein the guidance devices are provided between the code element and the reading device and move the reading device radially across the reading direction.

21. Angle of rotation sensor according to claim 20, wherein the guides consist of a tongue-and-groove connection, where the connecting means belonging to the code element are arranged in a spiral.

22. Angle of rotation sensor according to claim 17, wherein the code element is a code disk, and the guidance means provided for the code disk is a spiral groove, and the code is arranged on the bottom of the groove, and the reading elements of the reading device are arranged on the reading device on the surface of the projection facing the bottom of the groove.

23. Angle of rotation sensor according to claim 17, wherein the code is a maximum code which extends over the entire spiral code track.

24. Angle of rotation sensor according to claim 17, wherein the reading device is a CCD line, which is tangential to the essentially circular code tracks.

25. Angle of rotation sensor according to claim 17, wherein the code element is illuminated by a stationary light source, using either the transmitted light principle or the reflected light principle.

26. Angle of rotation sensor according to claim 17, wherein the light source is arranged so that it is movable and lights up part of the code element directly in the area of the reading device, or the light source is stationary and the part of the code element in the area of the reading device is lighted via an optical fiber which follows it.

\* \* \* \* \*